(12) United States Patent
Perraud (10) Patent No.: US 7,446,693 B1
(45) Date of Patent: Nov. 4, 2008

(54) PHASE DOMAIN ANALOG TO DIGITAL CONVERTER

(75) Inventor: Laurent Claude Perraud, Acton, MA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 11/750,501

(22) Filed: May 18, 2007

(51) Int. Cl.
*H03M 1/12* (2006.01)
(52) U.S. Cl. ........................ 341/155; 341/161
(58) Field of Classification Search ............ 341/155, 341/161, 157; 327/100, 161, 158
See application file for complete search history.

(56) References Cited

U.S. PATENT DOCUMENTS

| 3,611,435 | A | * | 10/1971 | Cooper ........................ 375/211 |
| 5,010,346 | A | * | 4/1991 | Hamilton et al. ............ 341/137 |
| 6,008,748 | A | | 12/1999 | Sterzer |
| 6,794,912 | B2 | * | 9/2004 | Hirata et al. ................ 327/158 |
| 6,822,596 | B2 | | 11/2004 | Theiler |
| 7,085,337 | B2 | * | 8/2006 | Dyer et al. .................. 375/354 |
| 7,143,301 | B2 | * | 11/2006 | Pearce et al. ............... 713/401 |
| 7,212,138 | B1 | | 5/2007 | Bosnyak |
| 7,254,598 | B2 | * | 8/2007 | Yomo et al. ................. 708/319 |
| 2002/0060638 | A1 | | 5/2002 | Nishii et al. |

OTHER PUBLICATIONS

Sohrab Samadian, *Student Member, IEEE*, Ryoji Hayashi, and Asad A. Abidi, *Fellow, IEEE*; Brief Papers, Demodulators for a Zero-IF Bluetooth Receiver, IEEE Journal of Solid-State Circuits, vol. 38, No. 8, Aug. 2003.
Levine P M et al: High resolution flash time-to-digital conversion and calibration for system-on-chip testing embedded microelectronic systems: status and trends (Part 2): IEEE Proceedings: Computers and Digital Techniques, IEE, GB, vol. 152, No. 3, May 6, 2005 pp. 415-426, XP006024722.
European Search Report, Application No. EP 08 15 6185.

* cited by examiner

*Primary Examiner*—Peguy JeanPierre (57) ABSTRACT

An analog to digital converter that first converts an analog input voltage into first and second periodic signals having a phase difference there between that is a function of the analog input voltage and then introduces the first periodic signal into a forward direction data path through a series of consecutive delay cells so that the first periodic signal propagates through the cells via the first series of delay elements in a first direction, and introduces the second periodic signal into a reverse direction data path through the same series of delay cells so that the second periodic signal propagates through the cells via the second series of delay elements in an opposite direction, and using the second periodic signal to latch the first periodic signal in each cell so as to generate an output signal for each cell, said output signals of said cells collectively indicating the unique cell in which the leading edges of corresponding pulses in the first and second directions met, and decoding the outputs of the cells to generate a digital binary output value.

23 Claims, 6 Drawing Sheets

PHASE DOMAIN ANALOG TO DIGITAL CONVERTER

FIELD OF THE INVENTION

The invention pertains to analog to digital converters.

BACKGROUND OF THE INVENTION

There are a large number of different techniques for converting a continuously variable analog voltage into a quantized digital (e.g., binary) value. In most types of analog to digital converters, the full scale range of the analog input signal is quantized into one of $2^n$ potential of binary values, where n is the number of bits at the output of the analog to digital converter.

U.S. Pat. No. 6,822,596 discloses an analog to digital converter that first converts an input analog voltage into n different pulse trains, each having a phase angle that is dictated by the input analog voltage, where $2^n$ is the resolution of the converter (i.e., there are $2^n$ possible digital output values). All $2^n$ input pulse trains have the same phase. The device further converts $2^n$ different reference voltages into $2^n$ reference pulse trains, each reference pulse train having a different phase angle. Each of the $2^n$ input pulse trains is compared to one of the $2^n$ reference pulse trains in one of $2^n$ comparators. The outputs of the $2^n$ comparators are supplied to $2^n$ flip flops. In accordance with this scheme, x flips flops will output a first binary value (e.g., 0) and y flip flops will output a second binary value (e.g., 1), where $x+y=2^n$. More particularly, the outputs of the x flip flops for which the phase angle of the input pulse train lags the phase angle of the corresponding reference pulse train will output a first value (e.g., 0), while the y flip flops for which the phase angle of the input pulse train leads the phase angle of the corresponding reference pulse train output a second value (e.g., 1). The outputs of the $2^n$ flip flops are provided to a decoder that converts the $2^n$ outputs to an n bit binary code. Such decoders are well known and commonly used in flash converters and the like. They often are constructed of relatively simple and fast combinatorial logic components.

SUMMARY OF THE INVENTION

According to a first aspect of the invention, a method of converting an analog input voltage into a digital value is provided comprising the steps of converting said analog input voltage into first and second periodic signals having a phase difference there between that is a function of said analog input voltage, introducing said first periodic signal into a first end of a first consecutive series of delay elements to cause said first periodic signal to propagate through said first series of delay elements in a first direction, introducing said second periodic signal into a second end of a second consecutive series of delay elements to cause said second periodic signal to propagate through said second series of delay elements in a second direction opposite said first direction, each said delay element in said first series having a corresponding delay element in said second series, and each pair of corresponding delay elements herein termed a delay cell, determining a delay cell in which a first event in said first periodic signal meets a second event in said second periodic signal, and generating a digital value based on said determination.

In accordance with a second aspect of the invention, an analog to digital converter is provided for converting an analog input voltage into a digital value comprising, at least one analog voltage to analog phase converter for receiving an analog input voltage and outputting a first periodic signal having a phase difference relative to a second periodic signal, said that phase difference being a function of said analog input voltage, a chain of delay cells, each cell comprising a first delay element and a second delay element, each of said first delay elements coupled in series in a first direction to form a first direction data path, and each of said second delay elements coupled in series in a second, opposite direction to form a second direction data path, said first periodic signal being coupled into said series of first delay elements at a first end of said chain and said second periodic signal being coupled into said series of second delay elements at a second end of said chain, each cell further comprising a storage element coupled to said first and second delay elements of said corresponding cell so as to store a signal value on said first direction data path in said cell responsive to an event on said second direction data path in said cell, said storage element providing at an output thereof said stored value, and a decoder having input terminals coupled to said outputs of said storage elements, said decoder adapted to convert said stored values into a digital number at its output.

DETAILED DESCRIPTION OF THE INVENTION

Figure 1:
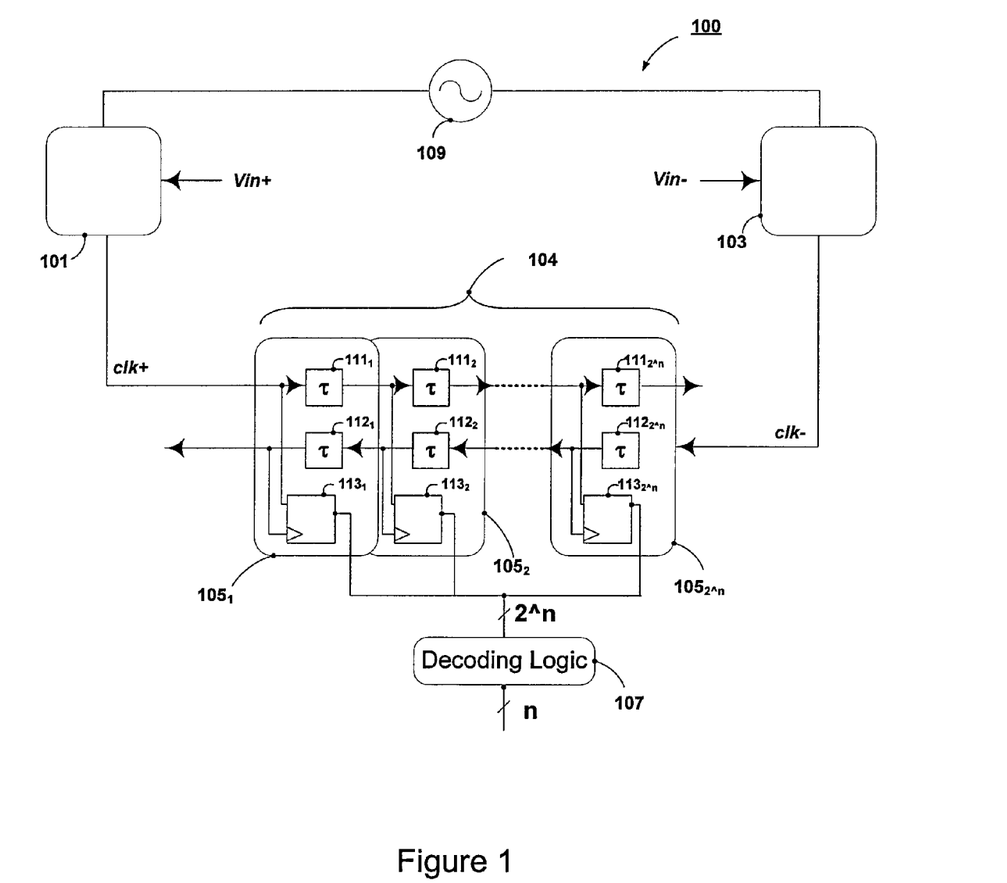
FIG. 1 is a block diagram of a differential analog to digital converter in accordance with a first embodiment of the present invention.
Figure 4:
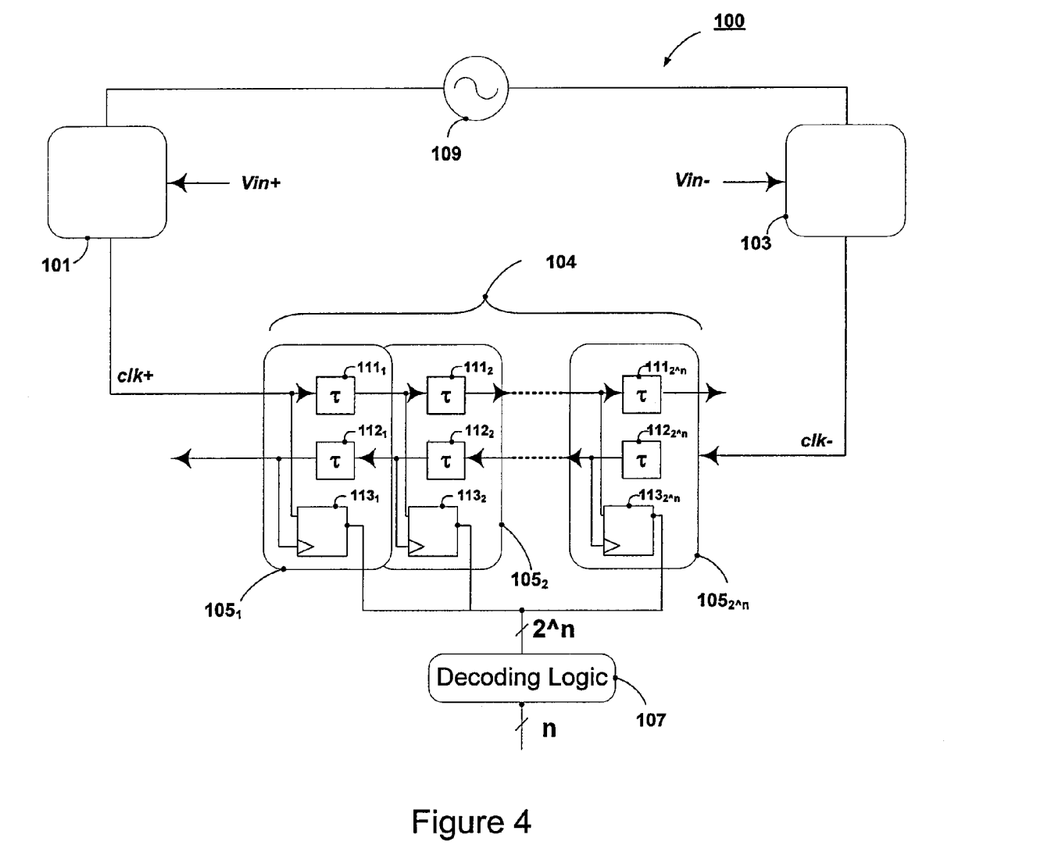
FIG. 4 is a block diagram of a single-ended analog to digital converter in accordance with another embodiment of the present invention.

FIG. 1 is a block diagram illustrating one embodiment of an analog to digital converter 100 in accordance with the principles of the present invention. This analog to digital converter is illustrated as a differential converter, i.e., the input voltage is supplied as two, differential signals. This is merely exemplary, as the invention can be implemented in a single ended implementation in which the input voltage is provided as a single signal relative to a reference voltage, such as the ground. As will be discussed further below, FIG. 4 is a block diagram illustrating an embodiment similar to the embodiment of FIG. 1, except adapted for use in connection with a single-ended input voltage.

In accordance with the embodiment of FIG. 1, the input voltage is supplied as two differential signals, Vin+ and Vin−. Vin+ is provided to the control input of a first analog voltage-to-analog phase circuit 101. Vin− is supplied to the control input of a second analog voltage-to-analog phase circuit 103. A clock 109 generates a regular, periodic signal, such as a square pulse train, and supplies it to the data inputs of circuits 101 and 103. Hence, the output, clk+, of the first analog voltage-to-analog phase circuit 101 is delayed by a period dictated by the value of Vin+, while the output, clk−, of the second analog voltage-to-analog phase circuit is delayed by a period dictated by the value of Vin−. Although many and varied circuits are possible for effecting an analog voltage to analog phase conversion, FIG. 1 illustrates an exemplary embodiment in which circuits 101 and 103 are delay circuits that delay the input clock pulse train by an amount (i.e., a phase angle) dictated by the voltage supplied to the central input (i.e., Vin+ or Vin−). The output of converter circuit 101 is herein termed clk+ (because it has been imparted with a phase delay dictated by Vin+) and the output of converter circuit 103 is termed clk− (because it has been imparted with a phase delay dictated by Vin−).

The signals clk+ and clk− are introduced into opposite ends of a chain 104 of sampling cells $105_1, 105_2, 105_3, \ldots, 105_{2^n}$, is the resolution of the analog to digital converter or, in other words, the converter 100 is an n bit converter.

FIG. 1 shows the contents of three of the sampling cells. However, it should be understood that all $2^n$ of the sampling cells are essentially identical to each other, except possibly for minor variations that will be discussed below in connection with FIG. 6, which is a circuit diagram of one possible circuit implementation of the sampling cells.

Each sampling cell $105_1$ through $105_{2^n}$ comprises a forward chain delay element 111, a reverse chain delay element 112, and a sampling circuit 113. The terms forward and reverse are exemplary and are merely used to distinguish between the two, opposing directions of propagation of signals through the chain 104, as will be discussed below. Furthermore, the two delay elements 111, 112 in a given sampling cell may be referred to herein as a delay cell. In the embodiment shown in FIG. 1, the delay elements are active circuit components. For instance, they may be inverters. However, as will be discussed further below, the delay elements can be virtually any element that will provide a known propagation delay of the clock signals therethrough. Furthermore, the sampling circuit is shown as a latch 113. However, this also is merely exemplary and other storage elements or other circuit components could be used as the sampling circuit, such as a flip-flop storage element.

The output of the respective delay element 111 or 112 in each sampling cell is delayed relative to the output of the corresponding delay element of the preceding sampling cell by the propagation delay, τ, of that delay element. Note that the "preceding" sampling cell depends on the direction of the particular clock signal propagation through that cell. For instance, the "preceding" cell for forward direction delay element $111_2$ of cell $105_2$ is cell $105_1$, whereas the "preceding" cell for reverse direction delay element $112_2$ of cell $105_2$ is cell $105_3$.

The clk+ signal introduced into delay element $111_1$ of cell $105_1$ will propagate through all of the sampling cells $105_1$ through $105_{2^n}$, in the forward direction, with each sampling cell delaying the clk+ signal by known amount, τ. Therefore, collectively, the propagation delay through the sampling cell chain is $\tau 2^n$. Likewise, the clk− signal introduced into delay element $111_{2^n}$ of cell $105_{2^n}$ will propagate through all of the sampling cells $105_{2^n}$ through $105_1$, in the reverse direction, with each sampling cell delaying the clk− signal by known amount, τ. Therefore, collectively, the propagation delay through the sampling cell chain in the reverse direction also is τ2n. Each sampling cell further includes a sampling circuit, such as a latch $113_1$ through $113_{2^n}$. One of the clk+ and clk− signals in the corresponding cell is tapped and provided to the clock input of the corresponding latch 113, while the other of the clk+ and clk− signals is provided to the data input of that latch 113. In the embodiment illustrated in FIG. 1, the output of the forward direction delay element 111 is used as the data input and the input of the reverse direction delay element 112 is used as the clock input. However, this is merely exemplary as the output of the reverse direction delay element 112 could just as readily be used as the data input and the input of the forward direction delay element 111 could be used as the clock input without changing the operation of the device (along with other slight modifications), as long as all of the cells 105 are consistent with each other.

The decoding logic 107 may comprise combinatorial logic for resolving the $2^n$ input values from the $2^n$ latches into an n bit binary code similarly to conventional decoders commonly used in flash converters.

Figure 2A:
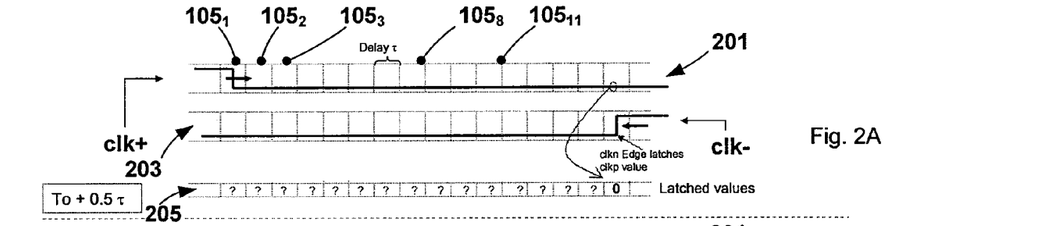
FIG. 2 is a timing diagram illustrating the propagation of signals through the sampling cells of the analog to digital converter of FIG. 1 for a first exemplary input voltage.
Figure 2B:
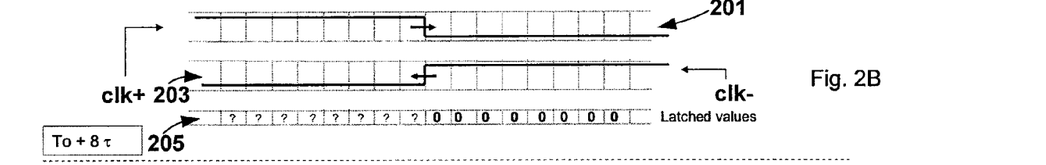
Figure 2C:
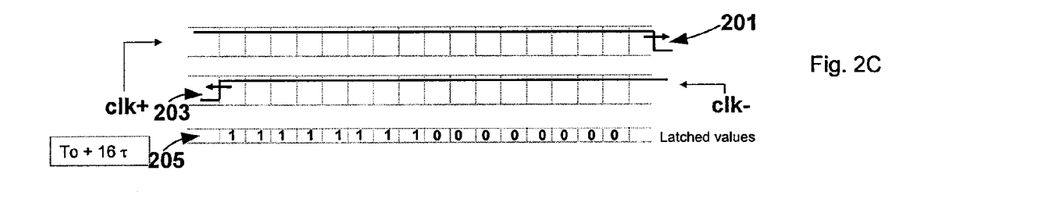

FIGS. 2A through 2C are timing diagrams that help illustrate the operation of the circuit of FIG. 1. The top line 201 in each of FIGS. 2A-2C shows the value of the clk+ signal and the bottom line 203 shows the value of the clk− signal. In the horizontal direction, each block corresponds to one of the sampling cells 105 in the sampling cell chain 104. The binary numerical value that will be latched by the latch in the corresponding cell is shown in line 205 of each figure.

For purposes of this example, we shall assume that the latches 113 are rising edge activated latches. However, it should be understood that this is merely exemplary. Finally, in the example illustrated by FIGS. 2A-2C, the sampling chain is 16 cells in length. Accordingly, this exemplary embodiment is a four bit analog to digital converter, i.e., n=4 such that $2^n=16$.

FIGS. 2A-2C illustrate the condition of the sampling cell chain at different times for the same single time sample of the input analog signal. Furthermore, in FIGS. 2A-2C, the exemplary input analog signal is Vin+=Vin−. More particularly, FIG. 2A illustrates the condition of the sampling cell chain at time t=0.5 τ, or, in other words, immediately after an analog input sample enters the chain. FIG. 2B illustrates the condition of the sampling cell chain at time t=8 τ. Finally, FIG. 2C illustrates the condition of the sampling cell chain at time t=16 τ.

Since Vin+=Vin−, the leading edge in the forward direction and the leading edge in the reverse direction enter the opposite ends of the chain at the same time. Accordingly, at the time t=0.5 τ illustrated in FIG. 2A immediately after the leading edge of clk+, enters cell $105_1$, the output of latch $113_1$ remains at whatever value it had latched with respect to the preceding analog input time sample (represented in the figures as a question mark). This is because the clk+ signal is provided to the data input terminal of the latch (while the clk− signal is provided to the clock input terminal of the latch). Hence, only a transition in clk− can cause any latch 113 to latch the data at its input. Any transition in clk+ that appears at the data input terminal of a latch 113 will not show up at the output of that latch until a transition in clk− reaches that latch and causes that latch to latch the data presented at its input.

On the other hand, latch $113_{2^n}$ at the opposite end of the sampling cell chain latches a 0 because clk− is coupled to the clock input of the latch $113_{2^n}$, causing latch $113_{2^n}$ to latch the data presented at its input at the time the transition in clk− reaches cell $105_{2^n}$, and, as can be seen from clk+ line 201, that data is 0 at time, t=0.5 τ.

The values latched (i.e., output) by latches $113_2$ through $113_{2^n-1}$ also are shown as question marks because their values also would be whatever value they had latched with respect to the preceding analog input time sample.

As the leading edges of the clk+ and clk− signals propagate through the chain 104 in opposite directions, the clk− signal will leave a trail of 0s behind it, while the clk+ signal will continue to have no effect on the condition of the output of the latches. This situation will persist until the single particular cell in which the leading edge of clk+ and the leading edge of clk− meet (which would be cell $105_8$ in this example and which would occur at time t=8 T because, in this example, Vin+=Vin−). The condition of the cell chain at this time t=8 T is illustrated in FIG. 2B. In cell $105_8$, as in all other cells, the corresponding latch will latch the data on clk+ when the latch is activated to latch by the leading edge of clk−. However, in that latch, the data on the clk+ line 201 is now a 1, not a 0, because the leading edge on clk+ reached that cell at or before the time the leading edge on the clk− on line 203 reaches that cell. (Note that tapping the clk− signal after the delay element 112, while tapping the clk+ signal before the delay element 111 assures that the leading edge on clk+ 201 reaches that cell before the time the leading edge on the clk− line 203 reaches that cell.)

From this point in time (i.e., t=8 T) forward, as the leading edge of clk− in the reverse direction reaches succeeding cells, $105_7$, $105_6$, $105_4$, . . . , $105_1$, the corresponding latches will latch 1s, rather than 0s. Thus, as can be seen in FIG. 2C, which illustrates the condition of the cell chain at time t=16 T, when the leading edges of the pulses on clk+ and clk− have both completely propagated through the chain 104, the outputs of the latches collectively comprise a series of consecutive 1s followed by a series of consecutive 0s, wherein the two adjacent cells for which the corresponding latch outputs are different values (i.e., 1, 0 or 0, 1) uniquely identifies the relative delays of clk+ and clk− the voltage of the analog input signal at the particular sampling instant, t=0.

Thus, the $2^n$ latch outputs are fed into decoding logic 107 that converts that data into an n bit binary output signal, which is the output of the analog to digital converter. Such decoders are known in the art. For instance, similar types of decoders for decoding $2^n$ input signals into an ambient binary output signal are commonly used in a flash analog to digital converters.

Figure 3A:
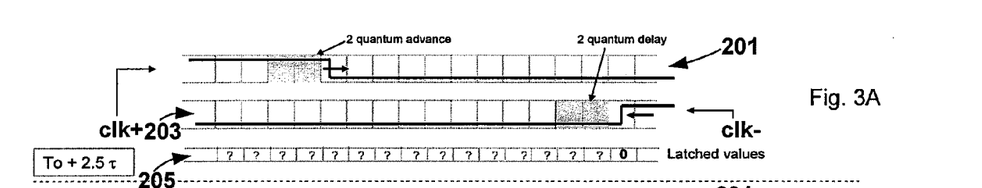
FIG. 3 is a timing diagram illustrating the propagation of signals through the sampling cells of the analog to digital converter of FIG. 1 for a second exemplary input voltage.
Figure 3B:
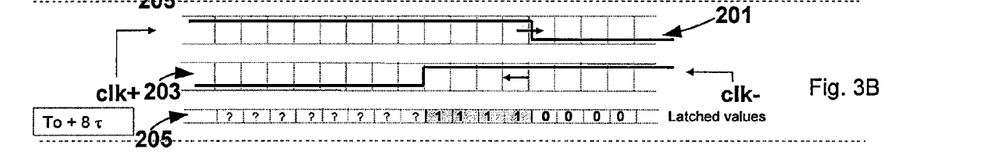
Figure 3C:
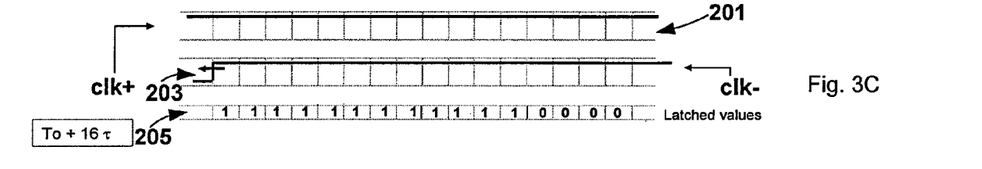

FIGS. 3A-3C are timing diagrams essentially identical to FIGS. 2A-2C, respectively, except that they illustrate the condition of the cell chain in response to a different analog input voltage, namely, an analog input voltage in which Vin+<Vin− (exact values are not necessary for present purposes of illustration). As was the case with respect to FIGS. 2A-2C, FIG. 3A shows the condition of the chain at time t=0.5 T, FIG. 3B shows the condition of the chain at time t=8 T, and FIG. 3C shows the condition of the chain at the time t=16 T. As can be seen from the Figures, operation is essentially the same as illustrated in FIGS. 2A-2C, except that the leading edges of clk+ and clk− meet simultaneously in a different cell. Particularly, since Vin+<Vin−, clk+ is delayed less than clk−, the leading edge of clk+ 201 will enter the chain earlier than the leading edge of clk− 203 thereby causing the counter-propagating leading edges to meet closer to the right end of the chain 104 than the left end of the chain. In this particular example, they meet in cell $105_{12}$, which again uniquely identifies the values of Vin+ and Vin−.

In the illustrated example, delays 112 are tapped at their outputs in the cells, whereas delays 111 are tapped at their inputs. This is merely exemplary. Both delay elements 111 and 112 can be tapped at their inputs, both could be tapped at their outputs, or delay elements 111 may be tapped at their outputs and delay elements 112 may be tapped at their inputs. It will be apparent to those skilled in the related arts that, the chosen option will dictate a built-in bias in the $2^n$ outputs from the cells, but will not affect the basic principles upon which the operation of the circuit is based. That is, the locations of the taps will determine, for any given input analog voltage, whether the transition from 0 to 1 will occur in a particular cell in the chain, e.g., $105_y$, or the next or previous cell in the chain, $105_{y+1}$ or $105_{y-1}$.

For instance, in the embodiment illustrated in FIG. 1, the inputs of the forward direction delay elements 111 are tapped and input into the data input terminals of the latches 113 and the outputs of the reverse direction delay elements 112 are tapped and input into the clock terminals of the latches 113. As such, the clock signal that is provided to the clock input of the latch (clk− in FIG. 1) will be delayed one more period, T, than the clock signal that is provided to the data input of the latch (clk+ in FIG. 1). This will ensure that the latch in the cell 105 in which the leading edge of the clock pulse that controls the latch 113 to latch data (e.g., clk−) meets the leading edge of the clock pulse that comprises the data that will be latched by the latch (e.g., clk+), will latch the value at its data input after the transition at its data input and not before the transition. If, on the other hand, the outputs of the forward direction delay elements 111 were tapped and input into the data input terminals of the latches 113 and the inputs of the reverse direction delay elements 112 were tapped and input into the clock terminals of the latches 113, the clock signal that is provided to the clock input of the latch (clk− in FIG. 1) will be delayed one less period, T, than the clock signal that is provided to the data input of the latch (clk+ in FIG. 1). This would ensure that, when the leading edge of the clock pulse that controls the latch 113 to latch data (e.g., clk−) meets the leading edge of the clock pulse that comprises the data that will be latched by the latch (e.g., clk+) in the one particular cell, the latch will latch the value at its data input before the transition at its data input and not before the transition.

Hence for a given analog input voltage, in the first embodiment illustrated by FIG. 1, the transition would occur, for instance in cell $105_y$, whereas, in the second embodiment, the transition would occur in cell $105_{y+1}$. As long as the built-in bias is understood and factored into the conversion performed by the decoding logic 107, any set of connections can be accommodated.

Note that, with respect to some connection paradigms, such as the second embodiment discussed in the immediately preceding paragraphs, there would need to be one more cell, i.e., $2^n+1$ cells, in order to provide for the described offset (or bias) by one cell.

In even other embodiments, a small delay may be added to the clock signal that is coupled to the clock input terminals of the latches outside of and preceding the cell chain.

In the examples provided above, the period of the sampling clock, i.e., the time between leading edges of consecutive pulses, is the sampling rate of the analog to digital converter. In the illustrated example, the sampling clock 109 has a 50% duty cycle and a period at least twice the collective delay through the entire sampling cell chain (i.e., clock period $\geq 2^n T$). This will ensure that there will be only one edge transition (e.g., leading edge of a clock pulse) in each direction inside the sampling cell chain 104 at any given instant. This is not a necessary limitation of the inventive apparatus, but is employed in this exemplary embodiment in order to simplify the explanation of the operation of the inventive circuit. Particularly, as will become clear from the discussion below, the particular cell in which the forward propagating leading edge of clk+ and the reverse propagating leading edge of clk− meet simultaneously dictates the digital value that will be provided at the output of the analog to digital converter for that time sample. Thus, with this limitation, it is assured that there will be only one time sample in the sampling cell chain at any given instant. This is not necessary and it is possible for there to be two or more time samples in the sampling cell chain at any given instant; however, the decoding logic 107 would need to be more complex in order to keep track of which edge corresponds to which time sample.

FIG. 4 illustrates an alternative embodiment of the invention. This embodiment corresponds essentially to the particular embodiment illustrated by FIG. 1, except that it is a single ended embodiment, rather than a differential embodiment. Note that the only significant difference between the embodiments of FIGS. 1 and 4 is that the input to the second delay element 103 is a reference voltage, Vref, rather than Vin−. In a further alternative embodiment, the second delay element 103 may be completely eliminated and the clock 119 fed directly into the second end of the chain.

Figure 5:
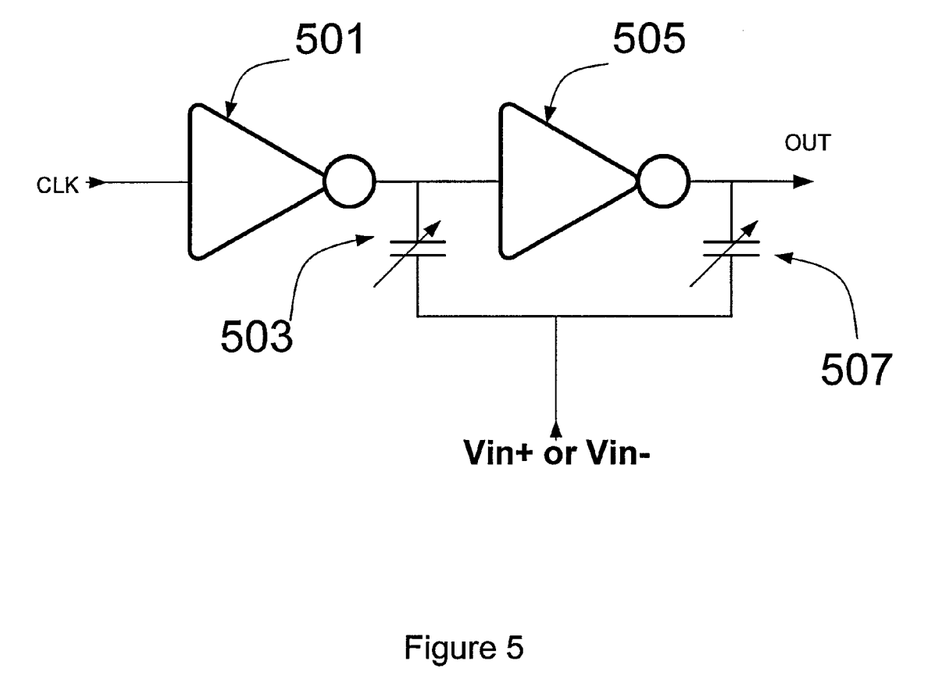
FIG. 5 is a circuit diagram of one possible embodiment of a circuit that can be implemented as the voltage to phase converter delay circuit in the analog to digital converter of FIG. 1.

FIG. 5 is a circuit diagram of one exemplary circuit that can be used as voltage-to-phase converters 101 or 103. Converters 101, 103 are the circuit components that essentially convert the analog input voltage into an analog phase signal by means of delaying the sampling clock 109 by an amount proportional to the value of the input voltage. The voltage-to-phase converter of FIG. 5 comprises a first inverter 501 followed by a variable capacitor 503 further followed by a second inverter 505 and finally followed by a second variable capacitor 507. The output of the sample clock 109 is provided to the input of the first inverter 501. The output of the first inverter is provided to the input of the second inverter 505. The top plate of the first variable capacitor 503 is coupled to the path between the two inverters 501,505 while its bottom plate is coupled to the corresponding input voltage signal, e.g., Vin+ or Vin−, as the case may be. The output of the second inverter 505 the delayed clock signal clk+ or clk− is that coupled into the sampling cell chain.

In operation, the variable capacitors 503,507 provide greater capacitance when the voltage provided on their lower plates are lower. Accordingly, the inverter 501 or 505 feeding the top plate of the capacitor sees a larger load and, hence, its propagation delay is longer.

There are two inverters and two variable capacitors coupled in series in the preferred embodiment illustrated by FIG. 5. This is because variable capacitors generally have a linear function of capacitance versus voltage across the capacitor. However, the delay of an inverter generally is an exponential function of the load. Accordingly, using only a single inverter and a single variable capacitor will cause the delay of the circuit 101, 103 to be an exponential function of the analog input voltage, whereas it should preferably be a linear function. Providing two such circuits in series, however, will cause the overall delay to have an S curve shape as a function of the input voltage, which much more closely approximates the desired linear relationship.

FIG. 5 shows merely one potential embodiment of the voltage-to-phase conversion circuitry. Many other possibilities exist. One advantage of the particular embodiment illustrated in FIG. 5 is that it has a rail-to-rail analog input range, (i.e., the entire voltage range between the two voltage rails).

Figure 6:
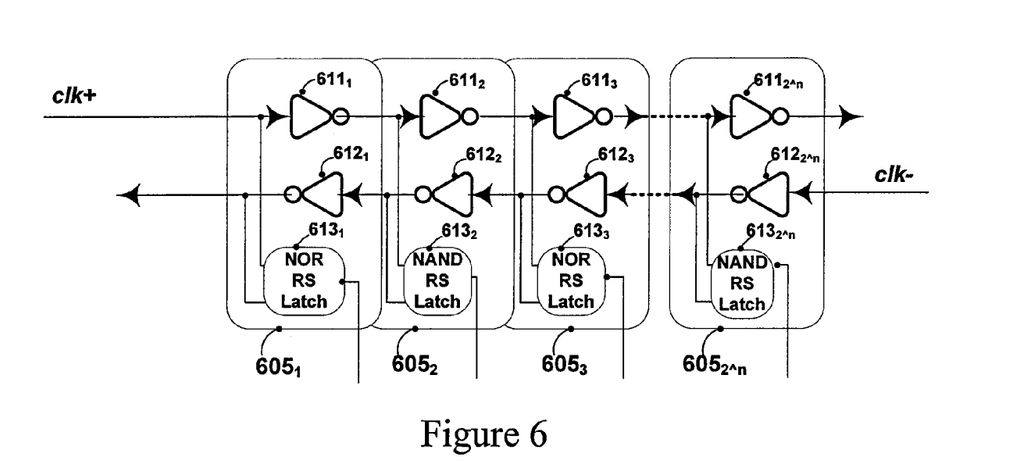
FIG. 6 is a circuit diagram of one possible embodiment of a circuit that can be implemented as the sampling cells in the analog to digital converter of FIG. 1.

FIG. 6 is a circuit diagram illustrating one exemplary circuit that can be used for the sampling cells $605_1$ through $605_{2^n}$. FIG. 6 illustrates a differential embodiment of the cells, as in the FIG. 1 embodiment, in which the input into the cell chain in the forward direction (left to right in FIG. 6) is a positive clock, clk+, and the input in the reverse direction (right to left in FIG. 6) is a negative clock, clk−. In this particular embodiment, every other sampling cell is identical, but each pair of adjacent cells are slightly different from each other. Particularly, similarly to FIG. 1, FIG. 6 shows that each sampling cell comprises a forward direction delay element, in this case an inverter $611_1$, $611_2$, $611_3$, etc., a reverse direction inverter $612_1$, $612_2$, $112_3$, and a latch $613_1$, $613_2$, $613_3$, etc.

The latch $613_1$ in the first cell $605_1$ and every alternate cell thereafter, e.g., $605_3$, $605_5$, $605_7$, etc. is a NOR RS latch, while the latch $613_2$ in the second cell $605_2$ and every alternate cell thereafter, e.g., $605_4$, $605_6$, $605_8$, etc. is a NAND RS latch.

The reason the latches 613 in consecutive cells alternate between NOR and NAND latches is because the delay element in each cell is an inverter. As a result, the counter-propagating clock signals get inverted every cell. Hence, rising edges become falling edges and vice versa and high data values become low data values and vice versa for every cell the signals propagate through. This reversal of data values each cell should be addressed in the design to assure that the $2^n$ outputs of the cells are correctly converted into a n bit value by the decoding logic 607. One simple way to address it is to use a NOR latch in the odd cells, $605_1$, $605_3$, $605_5$, etc, and a NAND latch in the even cells, $605_2$, $605_4$, $605_6$, etc. such that all of the latches latch the data at their data input terminals responsive to the same polarity edge and that all of the latches latch data of consistent polarity.

In embodiments for which the delay element does not invert the signal, this is not an issue. Furthermore, numerous other possible techniques and circuitry for solving the aforementioned issue should be apparent to persons of skill in the art.

As should be apparent from the discussion above, the delay elements do not need to be inverters and can be any circuit component that has a known, uniform propagation delay. An inverter is a particularly suitable choice for several reasons. First, it is simple, low cost, and has a very short propagation delay, τ. The propagation delay, τ, essentially dictates the maximum sampling frequency of the analog to digital converter. Accordingly, the shorter the propagation delay, τ, the faster the analog to digital converter. For example, in a simple embodiment of the invention in which only a single sample of the input voltage is permitted in the sampling cell chain at any given time, the maximum allowable sampling rate of the converter will be $2^n$τ, since this is the total propagation time of an edge through the entire chain. Also note that τ is the digital resolution of the system.

Of course, in theory, by implementing more sophisticated decoding logic 107, it should be possible, if desired, to permit more than one input voltage sample to propagate through the chain 105 at any given instant. Particularly, the only information that the decoding logic needs in order to determine the value of a given input voltage sample is the location of the two adjacent sampling cells that output different values (e.g., 1 and 0). More sophisticated decoding circuitry can be designed to distinguish and keep track of multiple sets of counter-propagating edges.

Some of the advantages of an analog to digital converter in accordance with the principles of the present invention include extremely low power consumption. Specifically, power consumption is estimated to be below 0.5 pico joules per conversion step for a 40 MHz, eight-bit converter. Power consumption is particularly low if the invention is implemented in CMOS circuitry because the inverters and latches draw power only during transitions. Power consumption is so low because, at any given instant, a maximum of only two inverters and one latch can be transitioning. Also, the quantization through the cell chain is extremely linear. Furthermore, because the sampling cells are purely digital, it is possible to run them at a much lower voltage than the technology voltage (for example 3.3 volts for CMOS). Doing so, however, may require slower sampling rates. Size, power, and sample rates in the illustrated embodiments each are linear functions of the number of cells (and are thus exponential functions of the number of output bits of the converter). Even further, the resolution of the converter is made insensitive to clock jitter if the same polarity edge is used in both directions in the cell chain.

In alternative embodiments, use of passive delay elements rather than active delay elements should permit even smaller values for τ, which would permit faster sampling rates and greater resolution since the permissible sampling rate is a function of $2^n\tau$, as previously explained, and T defines the digital resolution of the system. Any reasonable LC circuit component could be used as a passive delay element in connection with the present invention. In one particular alternative embodiment utilizing passive delay elements, the delay element in each direction throughout the entire chain collectively comprises a single continuous transmission line, in which the delay element of each cell comprises a short portion thereof (all of the cells have a length of the transmission line therein). The transmission line would simply be tapped in each sampling cell and provided to the appropriate terminal of the latch in that sampling cell.

The delay for each cell should be equal only if the desired resolution of the analog to digital converter is intended to be linear. Analog-to-digital converters that do not have linear resolutions are well known. Particularly, many analog-to-digital converters have higher resolution in the middle of their full-scale ranges than near the ends. In such circumstances, analog-to-digital converters in accordance with the present invention can be implemented such that the sampling cells near the middle of the sampling cell chain have smaller values of τ than the sampling cells near the ends of the sampling cell chain.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A method of converting an analog input voltage into a digital value comprising the steps of:
   converting said analog input voltage into first and second periodic signals having a phase difference there between that is a function of said analog input voltage;
   introducing said first periodic signal into a first end of a first consecutive series of delay elements to cause said first periodic signal to propagate through said first series of delay elements in a first direction;
   introducing said second periodic signal into a second end of a second consecutive series of delay elements to cause said second periodic signal to propagate through said second series of delay elements in a second direction opposite said first direction, each said delay element in said first series having a corresponding delay element in said second series, and each pair of corresponding delay elements herein termed a delay cell;
   determining a delay cell in which a first event in said first periodic signal meets a second event in said second periodic signal; and
   generating a digital value based on said determination.

2. The method of a claim 1 wherein said determining step comprises determining in which delay cell said first event and said second event meet.

3. The method of claim 2 wherein said determining step further comprises:
   detecting in each cell said first event; and
   responsive to detection of said first event in a particular cell, sampling said second periodic signal in said particular cell to determine if said second event has occurred in said particular cell.

4. The method of claim 3 wherein said determining step comprises latching said second periodic signal responsive to said detection of said first event.

5. The method of claim 4 wherein said detection of said first event in each said cell is performed after said first periodic signal propagates through said delay element of said cell of said first series of delay elements and wherein said sampling of said second periodic signal is performed before said delay element of said second series of delay elements of said cell.

6. The method of claim 3 wherein said generating step comprises transforming said samples collected from said plurality of cells into a binary number.

7. The method of claim 1 wherein all of said delay elements in said first series of delay elements and said second series of delay elements provide an equal amount of delay.

8. The method of claim 1 wherein said converting step comprises:
   providing two identical periodic reference signals;
   delaying one of said reference signals relative to the other of said reference signals an amount proportional to said input analog voltage.

9. The method of claim 1 wherein said first periodic signal comprises a first pulse train, said second periodic signal comprises a second pulse train, said first event comprises a transition edge of a pulse in said first pulse train, and said second event comprises a transition edge of a pulse in said second pulse train.

10. The method of claim 9 wherein said first pulse train and said second pulse train have periods greater than or equal to a total delay through said plurality of delay cells.

11. An analog to digital converter for converting an analog input voltage into a digital value comprising:
   at least one analog voltage to analog phase converter for receiving an analog input voltage and outputting a first periodic signal having a phase difference relative to a second periodic signal, said that phase difference being a function of said analog input voltage;
   a chain of sampling cells, each cell comprising a first delay element and a second delay element, each of said first delay elements coupled in series in a first direction to form a first direction data path, and each of said second delay elements coupled in series in a second, opposite direction to form a second direction data path, said first periodic signal being coupled into said series of first delay elements at a first end of said chain and said second periodic signal being coupled into said series of second delay elements at a second end of said chain;
   each cell further comprising a storage element coupled to said first and second delay elements of said corresponding cell so as to store a signal value on said first direction data path in said cell responsive to an event on said second direction data path in said cell, said storage element providing at an output thereof said stored value; and
   a decoder having input terminals coupled to said outputs of said storage elements, said decoder adapted to convert said stored values into a digital number at its output.

12. The analog to digital converter of claim 11 wherein said analog voltage to analog phase converter comprises:
   a source of a periodic signal;

a first voltage controlled delay element having a data input terminal coupled to said periodic signal, a control input coupled to said analog input voltage, and an output terminal coupled to one of said first and second ends of said chain.

13. The analog to digital converter of claim 12 wherein said first voltage controlled delay element comprises:
- a first inverter having a data input terminal coupled to said periodic signal and an output terminal;
- a first variable capacitor comprising a first plate and a second plate, said first plate being coupled to said output terminal of said first inverter and said second plate coupled to said analog input voltage;
- a second inverter having a data input terminal coupled to said output terminal of said first inverter and said first plate of said first variable capacitor;
- a second variable capacitor comprising a first plate and a second plate, said first plate being coupled to said output terminal of said second inverter and to said one end of said chain, and said second plate coupled to said analog input voltage.

14. The analog to digital converter of claim 11 wherein said chain comprises $2^n$ cells and said decoder converts said $2^n$ stored values into an n bit binary number.

15. The analog to digital converter of claim 11 wherein each delay element comprises an inverter.

16. The analog to digital converter of claim 11 wherein, in each cell, said first delay element comprises a first inverter having an input terminal and an output terminal in said first direction data path, said second delay element comprises a second inverter having an input terminal and an output terminal in said second direction data path, and said storage elements comprises a data input terminal and a clock terminal, said storage element adapted to store and output a value presented at its data input terminal responsive to a transition at its clock terminal, and wherein said data input terminal of said storage element is coupled to said first data path in said corresponding cell and said clock terminal of said storage element is coupled to said second data path in said corresponding cell.

17. The analog to digital converter of claim 16 wherein said clock terminal of said storage element is coupled to said second data path at said output terminal of said second inverter and wherein said data input terminal of said storage element is coupled to said first data path at said input terminal of said first inverter.

18. The analog to digital converter of claim 11 wherein each delay element comprises a passive delay element.

19. The analog to digital converter of claim 18 wherein said first direction data path comprises a first transmission line, each cell comprising a portion of said first transmission line, and wherein said second direction data path comprises a second transmission line, each cell comprising a portion of said second transmission line.

20. The analog to digital converter of claim 19 wherein each said storage element is a latch.

21. The analog to digital converter of claim 19 wherein said storage element is a flip flop.

22. The analog to digital converter of claim 12 wherein said periodic signal comprises a pulse train and said event on said second direction data path comprises a transition edge of a pulse.

23. The method of claim 22 wherein said pulses of said pulse train have a period greater than or equal to a total delay through said plurality of sampling cells.

* * * * *